United States Patent
Kobayashi et al.

(10) Patent No.: US 12,349,285 B2
(45) Date of Patent: Jul. 1, 2025

(54) COMPONENT MOUNTER

(71) Applicant: FUJI CORPORATION, Chiryu (JP)

(72) Inventors: Takahiro Kobayashi, Chiryu (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 497 days.

(21) Appl. No.: 17/779,253

(22) PCT Filed: Dec. 16, 2019

(86) PCT No.: PCT/JP2019/049135
§ 371 (c)(1),
(2) Date: May 24, 2022

(87) PCT Pub. No.: WO2021/124386
PCT Pub. Date: Jun. 24, 2021

(65) Prior Publication Data
US 2022/0394893 A1 Dec. 8, 2022

(51) Int. Cl.
*H05K 13/02* (2006.01)
*G06T 1/00* (2006.01)
*H05K 13/08* (2006.01)

(52) U.S. Cl.
CPC .......... *H05K 13/02* (2013.01); *G06T 1/0007* (2013.01); *H05K 13/0812* (2018.08); *H05K 13/0813* (2018.08)

(58) Field of Classification Search
CPC .... G06T 1/0007; H05K 13/02; H05K 13/043; H05K 13/0812; H05K 13/0813
See application file for complete search history.

(56) References Cited

U.S. PATENT DOCUMENTS 6,729,018 B1 * 5/2004 Takano .............. H05K 13/0813
29/832
8,333,010 B2 * 12/2012 Inaba ................. H05K 13/0465
198/465.1

(Continued)

FOREIGN PATENT DOCUMENTS

CN 105993212 A * 10/2016 ........... G06T 3/4053
EP 3 273 759 A1 1/2018

(Continued)

OTHER PUBLICATIONS

International Search Report issued Mar. 3, 2020 in PCT/JP2019/049135, filed on Dec. 16, 2019, 2 pages.

*Primary Examiner* — Minh N Trinh
(74) *Attorney, Agent, or Firm* — Oblon, McClelland, Maier & Neustadt, L.L.P.

(57) ABSTRACT

A component mounter includes a component supply device equipped with a bulk feeder for supplying multiple components in a bulk state to a supply region for the components, a camera configured to image the supply region, an image processing section configured to execute image processing for distinguishing a region of at least a part of the component from a region of a background in image data acquired through imaging by the camera based on brightness, and a state recognition section configured to recognize a supply state of the component based on at least one of an area and a shape of a component region occupied by at least the part of the component in the image data on which the image processing has been executed.

10 Claims, 7 Drawing Sheets

(56) References Cited

U.S. PATENT DOCUMENTS

| | | |
|---|---|---|
| 2001/0049876 A1 | 12/2001 | Yoshida et al. |
| 2020/0170154 A1 | 5/2020 | Sugihara |
| 2022/0394893 A1* | 12/2022 | Kobayashi ............ G06T 1/0007 |
| 2022/0400588 A1* | 12/2022 | Kotani ............... H05K 13/0812 |
| 2023/0106149 A1* | 4/2023 | Kobayashi ......... H05K 13/0409 |
| | | 382/141 |

FOREIGN PATENT DOCUMENTS

| | | |
|---|---|---|
| EP | 3 518 645 A1 | 7/2019 |
| JP | 6-21689 A | 1/1994 |
| JP | 11-311506 A | 11/1999 |
| JP | 2010-161243 A | 7/2010 |
| JP | 2011-114084 A | 6/2011 |
| JP | 2016-162900 A | 9/2016 |
| JP | 2016-219474 A | 12/2016 |
| JP | 2017-150927 A | 8/2017 |
| WO | WO 2017/208325 A1 | 12/2017 |

* cited by examiner

COMPONENT MOUNTER

TECHNICAL FIELD

The present disclosure relates to a component mounter.

BACKGROUND ART

A component mounter executes a mounting process for mounting components supplied by a bulk feeder or the like on a board. Bulk feeders are used to supply components accommodated in a bulk state. In the bulk feeders, there is a type of bulk feeder as shown in Patent Literature 1 which is configured to supply components in a bulk state to a supply region where a suction nozzle can pick up the components which are scattered thereover. In the mounting process, the component mounter executes image processing for recognizing a supply state of one of the components by the bulk feeder, and controls a pickup operation of the component using the suction nozzle based on the result of the image processing.

PATENT LITERATURE

Patent Literature 1: JP-A-2011-114084

BRIEF SUMMARY

Technical Problem

In a pick-and-place cycle which is repeatedly executed by the component mounter in the mounting process, there may be a case in which components equal in number to the number of multiple suction nozzles supported on a mounting head are picked up from the supply region of the bulk feeder. In order to enable this mounting process, it is desired not only to supply a large number of components to the supply region but also to improve the efficiency and precision of the image processing for recognizing the supply state.

It is an object of the present description to provide a component mounter capable of increasing the efficiency and precision of image processing for recognizing a supply state of a component in correspondence with a bulk feeder for supplying components in a bulk state.

Solution to Problem

The present description discloses a component mounter including a component supply device equipped with a bulk feeder for supplying multiple components in a bulk state to a supply region for the components, a camera configured to image the supply region, an image processing section configured to execute image processing for distinguishing a region of at least a part of the component from a region of a background in image data acquired through imaging by the camera based on brightness, and a state recognition section configured to recognize a supply state of the component based on at least one of an area and a shape of a component region occupied by at least the part of the component in the image data on which the image processing has been executed.

Advantageous Effects

According to this configuration, the supply state of the component is recognized based on at least one of the area and the shape of the component region in the image data on which the processing has been executed in which the region of at least the part of the component from the region of the background based on brightness. As a result, the component region is made clear against the background, whereby the precision of the image processing can be improved. In addition, since the supply state is recognized based on the area or the shape of the component region in the supply state recognition processing, a supply state of each of multiple components in a bulk state including whether the component is suitable for the mounting process can be recognized efficiently.

DESCRIPTION OF EMBODIMENTS

1. Configuration of Component Mounter 10

Component mounter 10 makes up a production line for producing board products together with multiple types of board work machines including, for example, another component mounter 10. The board work machines which make up the production line can include a printer, an inspection device, a reflow furnace, and the like.

1-1. Board Conveyance Device

Figure 1:
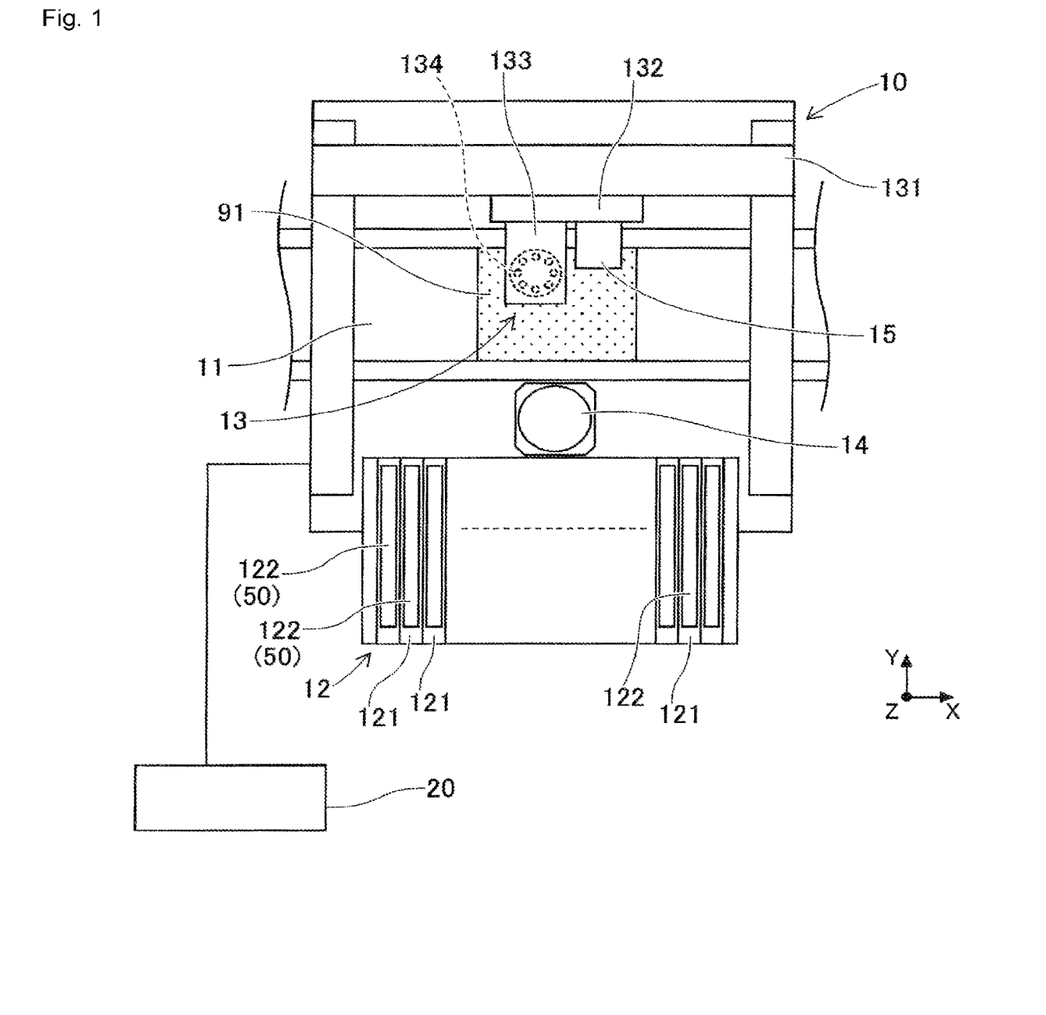
FIG. 1 is a schematic view showing a configuration of a component mounter.

As shown in FIG. 1, mounter 10 includes board conveyance device 11. Board conveyance device 11 sequentially conveys board 91 in a conveyance direction, and positions board 91 in a predetermined position in the mounter.

1-2. Component Supply Device 12

Component mounter 10 includes component supply device 12. Component supply device 12 supplies components to be mounted on board 91. Component supply device 12 is such that feeders 122 are mounted individually in multiple slots 121. Feeder 122 adopts, for example, a tape feeder in which a carrier tape accommodating multiple components is fed to be moved so as to supply the components to be picked up. Further, feeder 122 adopts bulk feeder 50 which supplies components accommodated therein in a bulk state (in a loose state in which individual components are oriented irregularly) so that the components can be picked up. Bulk feeder 50 will be described in detail later.

1-3. Component Transfer Device 13

Component mounter 10 includes component transfer device 13. Component transfer device 13 transfers a component supplied by component supply device 12 onto a predetermined mounting position on board 91. Component transfer device 13 includes head driving device 131, moving body 132, mounting head 133, and suction nozzles 134. Head driving device 131 moves moving body 132 in horizontal directions (an X-direction and a Y-direction) by a linear motion mechanism. Mounting head 133 is detachably fixed to moving body 132 by a clamp member, not shown, and is provided to be movable in the horizontal directions within the mounter.

Mounting head 133 supports multiple suction nozzles 134 in such a manner as to be rotated, and raised and lowered. Suction nozzle 134 is a holding member configured to pick up and hold component 80 supplied by feeder 122. Suction nozzle 134 picks up a component supplied by feeder 122 using a negative pressure air supplied thereto. As a holding member attached to mounting head 133, a chuck or the like can be adopted which holds a component by gripping the component.

Various types of mounting heads can be adopted for mounting head 133. Specifically, mounting head 133 includes a type of mounting head configured to support multiple holding members by a rotary head which is provided rotatably around an R-axis parallel to a vertical axis (a Z-axis). In the present embodiment, mounting head 133 supports 24 suction nozzles 134 by a rotary head. In addition, mounting head 133 includes a type of mounting head configured to support multiple holding members which are aligned in a straight line or a matrix configuration, a type of mounting head configured to support one holding member, and the like. These types of mounting heads 133 can be selected as required in accordance with types of board products to be produced.

1-4. Part Camera 14 and Board Camera 15

Component mounter 10 includes part camera 14 and board camera 15. Part camera 14 and board camera 15 are digital imaging devices having imaging elements such as CMOS. Part camera 14 and board camera 15 execute imaging based on control signals and send out image data acquired through the imaging. Part camera 14 is configured to image a component held by suction nozzle 134 from below. Board camera 15 is provided on moving body 132 in such a manner as to be movable in the horizontal directions together with mounting head 133. Board camera 15 is configured to image board 91 from above.

In addition to imaging a front surface of board 91 as an imaging target, board camera 15 can image various types of devices as long as they are situated within a movable range of moving body 132 as imaging targets. For example, in the present embodiment, board camera 15 can capture a supply region As (refer to FIG. 4), to which bulk feeder 50 supplies components 80, in visual field Vc thereof for imaging. In this way, board camera 15 can additionally be used to image different imaging targets in order to acquire image data for use in various types of image processing.

1-5. Control Device 20

Figure 5:
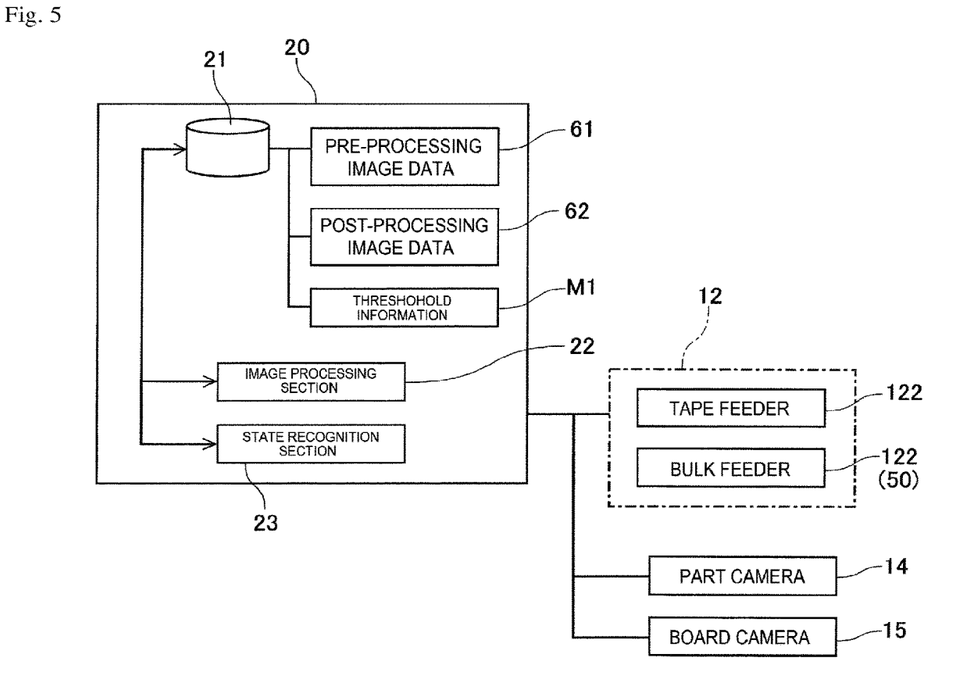
FIG. 5 is a block diagram showing a control device of the component mounter.

Component mounter 10 includes control device 20. Control device 20 is mainly made up of CPU, various types of memories, and a control circuit. As shown in FIG. 5, control device 20 includes storage section 21. Storage section 21 is made up of an optical drive device such as a hard disk device, a flash memory, or the like. Storage section 21 of control device 20 stores various types of data such as a control program used for controlling a mounting process. The control program denotes mounting positions and a mounting order of components which are to be mounted on board 91 in the mounting process.

Control device 20 executes recognition processing for recognizing a held state of each of components which are held individually by the multiple holding devices (suction nozzles 134). Specifically, control device 20 performs image processing on image data acquired through imaging by part camera 14 and recognizes a position and an angle of each component with respect to a reference position of mounting head 133. In addition to part camera 14, control device 20 may include, for example, a head camera unit or the like which is provided integrally on mounting head 133 so as to perform image processing on image data acquired as a result of the head camera unit imaging a component from a side, below or above.

Control device 20 controls mounting operations of components by mounting head 133 based on the control program to thereby execute the mounting process. The mounting process includes a process of repeating a pick-and-place cycle (hereinafter, referred to as a "PP cycle") including a pickup operation and a mounting operation multiple times. The "pickup operation" described above is an operation in which a component supplied by component supply device 12 is picked by suction nozzle 134.

In the present embodiment, in executing the pickup operation described above, control device 20 controls the operation of component supply device 12 including bulk feeder 50, and executes recognition processing for recognizing a supply state of component 80 in supply region As of bulk feeder 50. The "recognition processing for recognizing a supply state" described above includes processing for recognizing whether there exists component 80 that can be picked up in supply region As, and, when there exists such component 80, recognizing an orientation (position and angle) thereof. Then, control device 20 controls the operation of mounting head 133 in a pickup operation based on the result of the recognition processing of the supply state.

In addition, the "mounting operation" described above is an operation of mounting a picked up component in a predetermined mounting position on board 91. In the mounting process, control device 20 controls the operation of mounting head 133 based on pieces of information which are output from various types of sensors, the results of the image processing, the control program, and the like. As a result, the positions and angles of multiple suction nozzles 134 supported by mounting head 133 are controlled. A detailed configuration of control device 20 will be described later.

2. Configuration of Bulk Feeder 50

Figure 2:
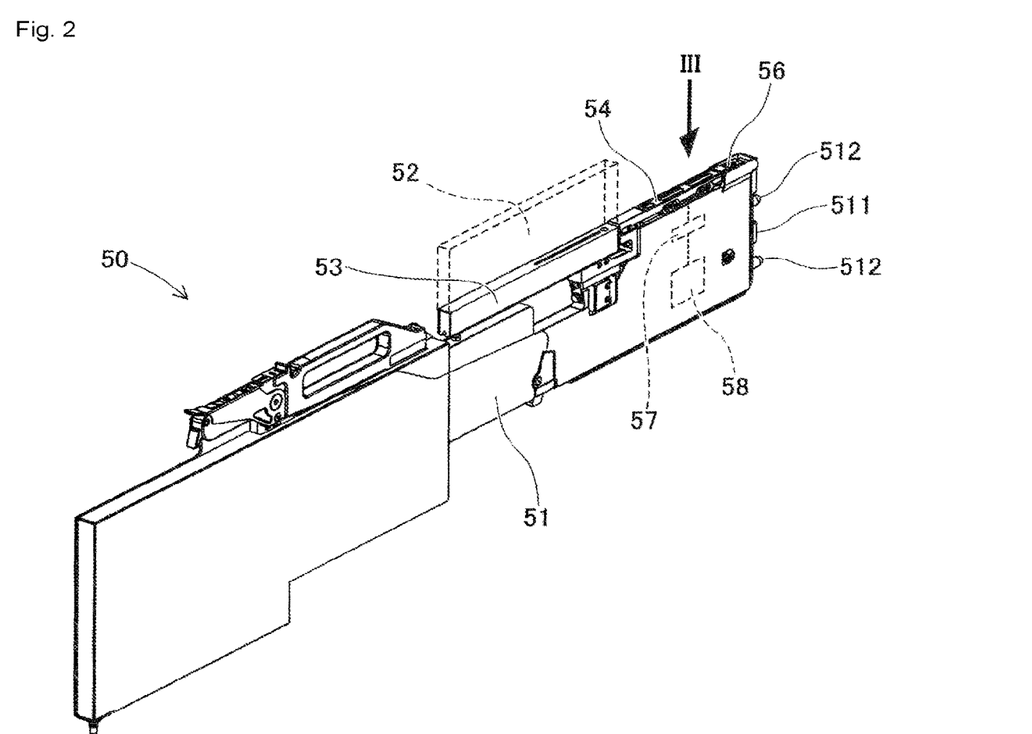
FIG. 2 is a perspective view showing an external appearance of a bulk feeder.

Bulk feeder 50 is equipped on component mounter 10 and functions as at least a part of component supply device 12. Unlike the tape feeder, bulk feeder 50 does not use a carrier tape, and therefore has an advantage in that carrier tape loading, used-up tape collection, and the like can be omitted. On the other hand, since bulk feeder 50 supplies components 80 accommodated therein in a bulk state in which components 80 are not aligned as on a carrier tape, a supply state of component 80 may affect a pickup operation by the holding member such as suction nozzle 134.

Figure 4:
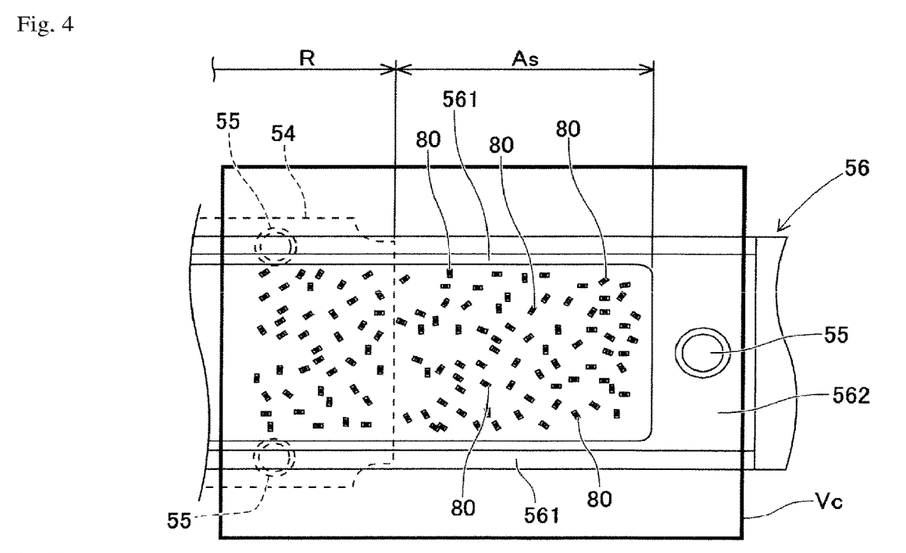
FIG. 4 is a diagram showing multiple components in a bulk state which are supplied by executing a component supply process.

Specifically, as shown in FIG. 4, when components 80 are so close to be in touch with each other or are piled on each other (a state in which components 80 are superposed on each other in an up-down direction) in supply region As, they cannot be a pickup target. In addition, since components 80 are supplied to supply region As while being oriented irregularly, component mounter 10 executes image processing for recognizing a supply state of component 80 (whether component 80 can be picked up and how component 80 is oriented when it is determined that component 80 can be picked up). The supply state recognition processing will be described in detail later.

2-1. Feeder Main Body 51

As shown in FIG. 2, bulk feeder 50 includes feeder main body 51. Feeder main body 51 is formed into a flat box shape. Feeder main body 51 is set in slot 121 of component supply device 12. Connector 511 and two pins 512 are formed on a front portion of feeder main body 51. Setting bulk feeder 50 in slot 121 causes connector 511 to be communicably connected to a main body side of component mounter 10. In addition, bulk feeder 50 is fed electrically via connector 511. Two pins 512 are used to position feeder main body 51 when that feeder main body 51 is set in slot 121.

2-2. Component Case 52, Discharge Device 53, and Cover 54

In the present embodiment, component case 52, which accommodates multiple components 80 in a bulk state, is detachably attached to feeder main body 51. Component case 52 is configured to discharge components 80 to the outside. In the present embodiment, component case 52 constitutes an external device of bulk feeder 50, and for example, there are provided various types of component cases 52, whereby one component case 52 suitable for a planned mounting process is selected to be attached to feeder main body 51.

Bulk feeder 50 includes discharge device 53. Discharge device 53 regulates the number of components 80 to be discharged from component case 52. Discharge device 53 supplies multiple components 80 which are discharged from component case 52 to receiving region Ar of track member 56, which will be described later. Bulk feeder 50 includes cover 54. Cover 54 is detachably attached to a front upper portion of feeder main body 51. Cover 54 prevents component 80 which are being conveyed on a conveyance path of track member 56, which will be described later, from scattering to the outside of bulk feeder 50. Pair of left and right circular reference marks 55, which indicate a reference position of bulk feeder 50, are attached to an upper surface of cover 54.

2-3. Track Member 56

Figure 3:
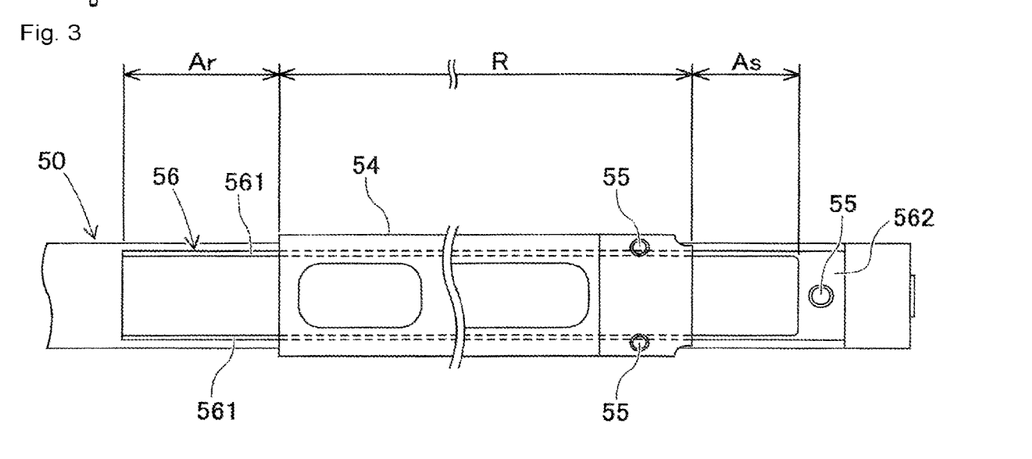
FIG. 3 is a plan view as seen from direction III in FIG. 2.

Bulk feeder 50 includes track member 56. Track member 56 is provided on the front upper portion of feeder main body 51. As shown in FIG. 3, track member 56 is formed in such a manner as to extend in a front-rear direction (a left-right direction in FIG. 3) of feeder main body 51. Pair of upwardly protruding side walls 561 are formed on both edges of track member 56 in a width direction (an up-down direction in FIG. 3) thereof. Pair of side walls 561 surround a circumferential edge of conveyance path R together with distal end portion 562 of track member 56 so as to prevent the departure of components 80 which are being conveyed along conveyance path R. Circular reference mark 55, indicating a reference position of bulk feeder 50, is affixed to an upper surface of distal end portion 562.

Track member 56, which is configured as described above, has receiving region Ar, supply region As, and conveyance path R. "Receiving region Ar" is a region for receiving components 80 discharged in bulk from component case 52. In the present embodiment, receiving region Ar is positioned below a discharge port of component case 52. In addition, "supply region As" is a region for supplying components 80. In other words, supply region As is a region where components 80 can be picked up by suction nozzles 134 supported on mounting head 133 and is contained in a movable range of mounting head 133.

Further, "conveyance path R" of track member 56 is a path along which components 80 pass from receiving region Ar to supply region As. In the present embodiment, conveyance path R is formed into a groove shape in which a groove bottom face is horizontal. Side surfaces of groove-like conveyance path R are made up of pair of side walls 561. An upper groove opening of conveyance path R is generally closed by cover 54. Track member 56 is supported in such a manner as to be slightly displaced (that is, to vibrate) with respect to feeder main body 51 in imaginary vertical planes formed in the front-rear direction and the up-down direction.

2-4. Vibration Device 57

Bulk feeder 50 includes vibration device 57. Vibration device 57 is provided in feeder main body 51. Vibration device 57 applies vibrations to track member 56 so that components 80 on conveyance path R are conveyed. As a result, vibration device 57 causes track member 56 to perform an elliptical motion in a clockwise or counterclockwise direction in a horizontal direction which is orthogonal to a conveyance direction of components 80 on conveyance path R. In this case, vibration device 57 causes track member 56 to vibrate in such a manner that forward or rearward and upward external forces is applied to components 80 on conveyance path R.

Vibration device 57 includes, for example, a support member for connecting together feeder main body 51 and track member 56, a piezoelectric element attached to the support member, and a driving section for supplying electric power to the piezoelectric element. The driving section changes the frequency and applied voltage of electric power to be supplied to the piezoelectric element based on a command from feeder control device 58, which will be described later. As a result, the frequency and amplitude of the vibration applied to track member 56 are adjusted, whereby a rotational direction of the elliptical motion of track member 56 is determined. Changing the frequency or amplitude of the vibration of track member 56 and the rotational direction of the elliptical motion caused by the vibration changes the conveyance speed of components 80 to be conveyed, the degree of dispersion of components 80, the conveyance direction of components 80, and the like.

As a result of the configuration described above, vibration device 57 applies a predetermined degree of vibration to track member 56, so that multiple components 80 discharged from component case 52 to receiving region Ar of track member 56 can be conveyed to supply region As via conveyance path R. Hereinafter, an operation of vibration device 57 for conveying components 80 on conveyance path R in a direction towards supply region As is referred to as a "feeding operation". In addition, an operation of vibration device 57 for conveying components 80 on conveyance path R in a direction towards receiving region Ar is referred to as a "returning operation". Switching between the feeding operation and the returning operation of vibration device 57 reverses the direction of the elliptical motion of the track member.

2-5. Feeder Control Device 58

Bulk feeder 50 includes feeder control device 58. Feeder control device 58 is mainly made up of CPU, various types of memories, and a control circuit. With bulk feeder 50 set in slot 121, feeder control device 58 is powered via connector 511 and is then allowed to communicate with control device 20 of component mounter 10. In a component supply process for supplying components to supply region As, feeder control device 58 controls the operation of vibration device 57 so as to execute the feeding operation and the returning operation described above.

Specifically, when executing the feeding operation, feeder control device 58 sends a command to the driving section of vibration device 57. This enables driving section to supply a predetermined amount of electric power to the piezoelectric element, whereby vibrations are applied to track member 56 via the support member. As a result, an external force is applied to components 80 on conveyance path R in such a manner as to move them forwards in the conveyance direction.

In addition, feeder control device 58 realizes various conveyance manners by combining execution times of the feeding operation and the returning operation of vibration device 57 and the like. For example, after at least a part of components 80 on conveyance path R have reached supply region As, feeder control device 58 continues the feeding operation until multiple components 80 reach the vicinity of distal end portion 562 of track member 56. During the continuation of the feeding operation, feeder control device 58 may execute further the returning operation and the feeding operation repeatedly so as to cause multiple components 80 to locate in supply region As with track member 56 left vibrating.

Thereafter, the feeder control device 58 may execute the returning operation to cause a part of components 80 to retreat towards receiving region Ar so that an appropriate amount of components 80 are caused to remain in supply region As. When executing the feeding operation and the returning operation, feeder control device 58 can set an execution time of a dispersing operation of components 80 and the like as required. In addition, feeder control device 58 may adjust at least one of the frequency and the amplitude of vibration applied to track member 56 by vibration device 57 in accordance with types of components 80 accommodated in component case 52.

3. Detailed Configuration of Control Device 20

Referring to FIGS. 5 to 10, a detailed configuration of control device 20 of component mounter 10 will be described. In FIGS. 6 to 10, a region having a color of black or close to black is shown as hatched as a matter of convenience. Storage section 21 stores image data 61 acquired through imaging by board camera 15 (hereinafter, also referred to as "pre-processing image data 61"), image data 62 on which image processing has been executed (hereinafter, also referred to as "post-processing image data 62"), and threshold information M1. Those image data 61, 62 and threshold information M1 will be described in detail later.

Figure 7:
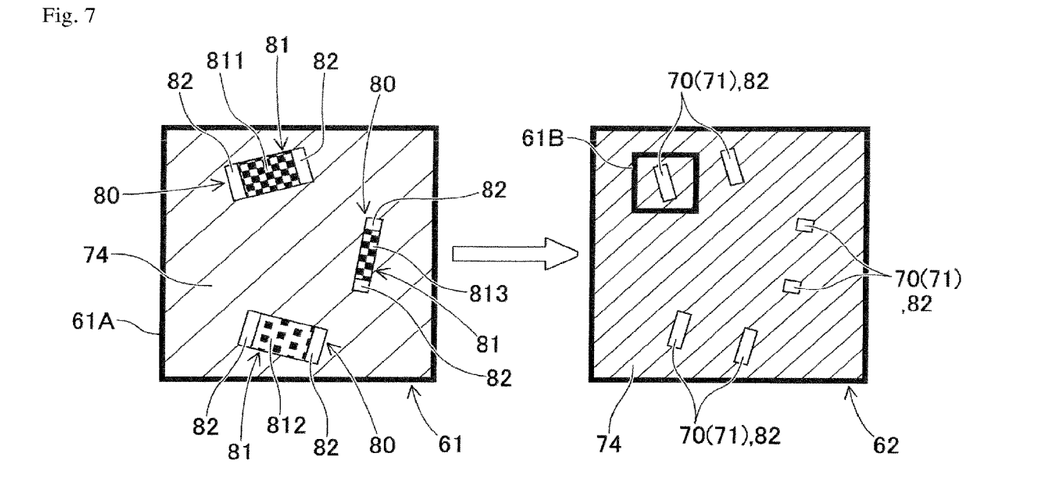
FIG. 7 illustrates enlarged views showing image data before and after processing respectively according to a first aspect of image processing.
Figure 8:
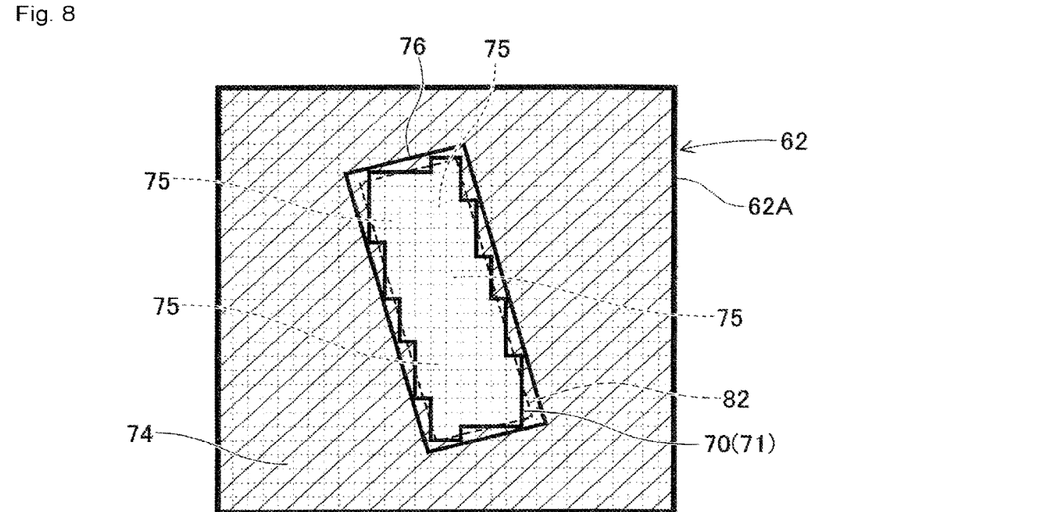
FIG. 8 is an enlarged view showing an extraction region in FIG. 7.
Figure 9:
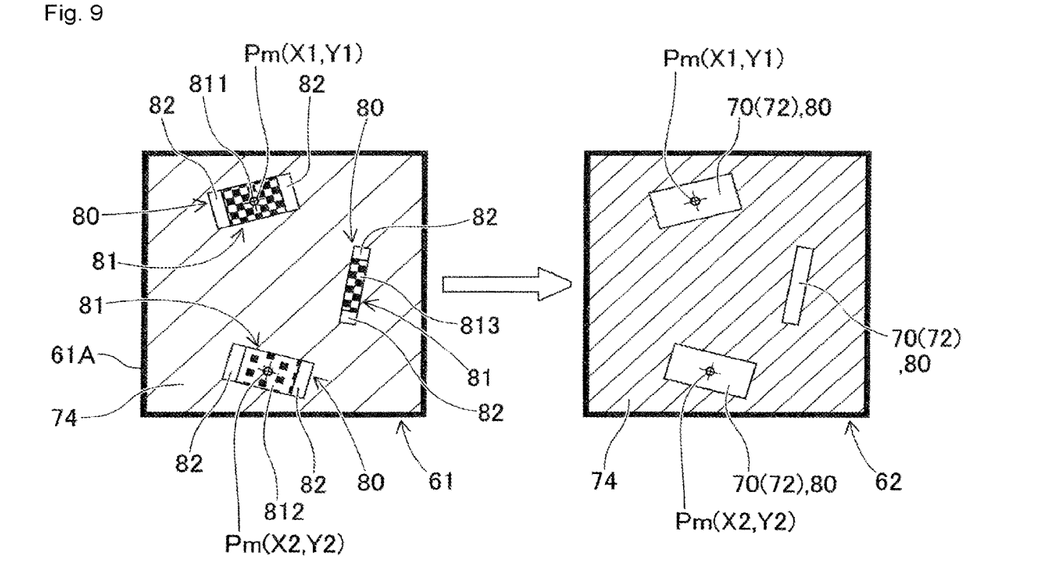
FIG. 9 illustrates enlarged views showing image data before and after processing respectively according to a second aspect of image processing.
Figure 10:
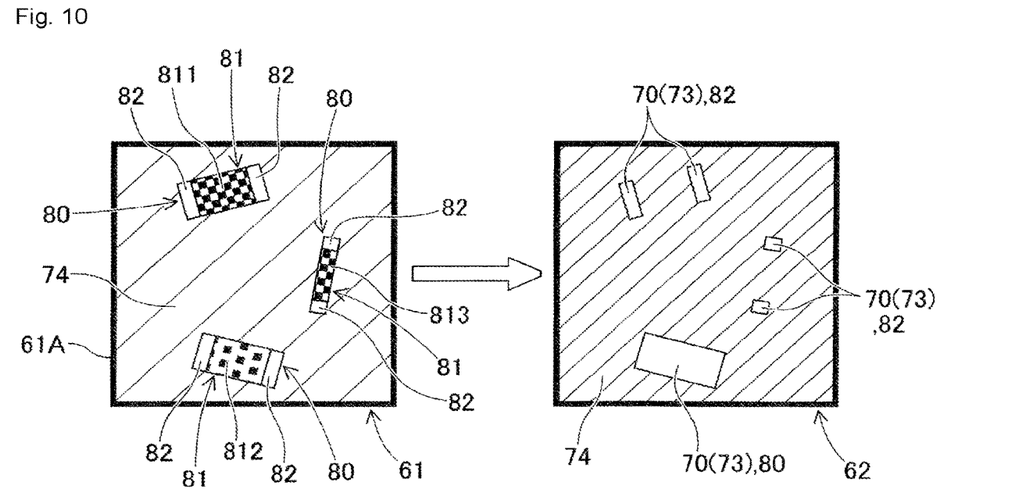
FIG. 10 illustrates enlarged views showing image data before and after processing respectively according a third aspect of image processing.

In FIGS. 7, 9, and 10, extraction region 61A in pre-processing image data 61 is shown in an enlarged fashion on a left-hand side. In FIGS. 7, 9, and 10, extraction region 61A in post-processing image data 62 is shown in an enlarged fashion on a right-hand side. FIG. 8 shows extraction region 62A in post-processing image data 62 shown in FIG. 7 in a more enlarged fashion.

3-1. Image Processing Section 22

Control device 20 includes image processing section 22. Image processing section 22 executes image processing for distinguishing a region of at least a part of component 80 and a region of background 74 in pre-processing image data 61 (refer to FIG. 6) acquired through imaging of supply region As as an imaging target by board camera 15 based on brightness. Specifically, in the present embodiment, image processing section 22 executes binarization processing on pre-processing image data 61 using threshold Th which is set to a value between the brightness of component 80 and the brightness of background 74.

Figure 6:
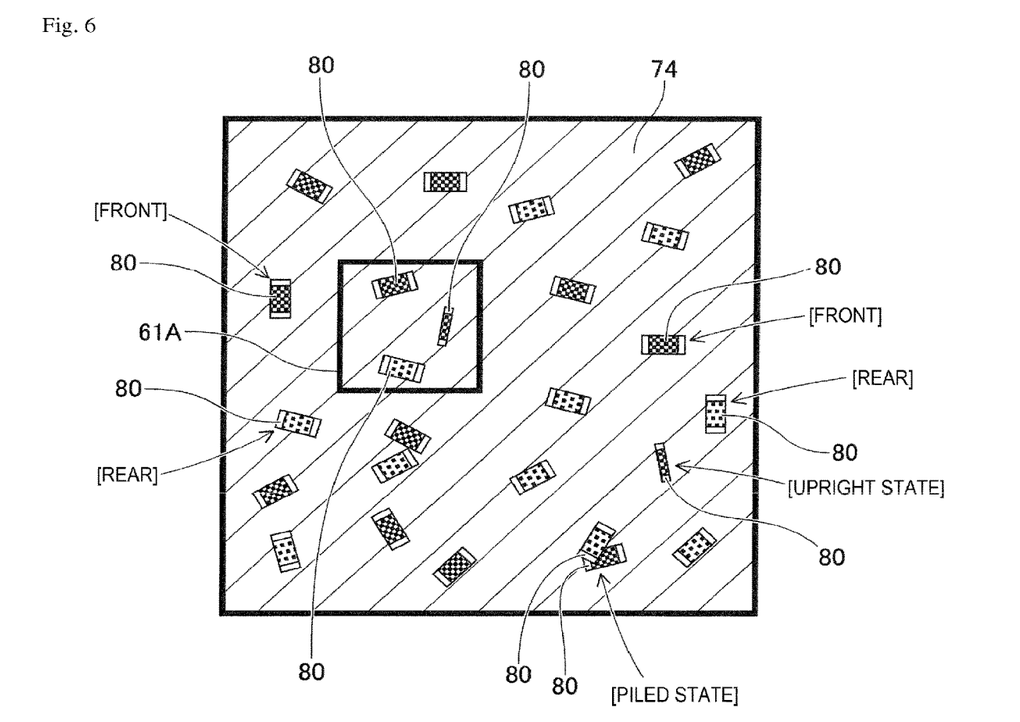
FIG. 6 is a diagram showing image data before processing which is used in recognition processing for recognizing supply states of components in a supply region.

The image processing described above is not necessarily required to visually distinguish the two regions from each other but is intended to improve the recognizability of the two regions by state recognition section 23, which will be described later. Therefore, in the image processing, image processing section 22 may increase or decrease the brightness values of the two regions or may color the two regions depending on the positions or the like thereof. In addition, the binarization processing need not necessarily distinguish a white region from a black region but may process so that the brightnesses of the two regions are set to their average brightnesses or predetermined brightness values, for example.

In addition, in the binarization processing, threshold Th can be set as required in accordance with various manners of the recognition process in which state recognition section 23 recognizes a supply state of component 80. This is because, depending on types of components 80, in one type of component 80, a front need be distinguished from a rear, and in another type of component 80, a certain adjustment need be executed due to similar brightnesses of component 80 and background 74 in pre-processing image data 61. For example, image processing section 22 acquires corresponding threshold Th from threshold information M1 in which thresholds Th are set in advance for types of components 80 which are supplied by bulk feeder 50, and executes binarization processing as image processing. After having executed the image processing, image processing section 22 maintains pre-processing image data 61 in its original state and stores separately post-processing image data 62 in storage section 21.

3-2. State Recognition Section 23

Control device 20 includes state recognition section 23. Control device 20 recognizes a supply state of component 80 based on at least one of an area and a shape of component region 70 which is occupied by at least a part of that component 80 in image data on which image processing is executed (post-processing image data 62). Here, various manners can be adopted for a series of image processing including the image processing by image processing section 22 and the supply state recognition processing by state recognition section 23. Hereinafter, a first, second, and third manners of image processing will be described as examples.

The "component region" is a region of at least a part of component 80 which is distinguished from a region of background 74 based on brightness by image processing, and corresponds to a region which is occupied by the whole of component 80 or a region which is occupied by pair of terminals 82 thereof, which will be described later. State recognition section 23 calculates an area of component region 70 and recognizes a supply state of component 80 including an orientation or the like thereof based on the degree of coincidence with an estimated area of component region 70. In place of or in addition to the area of component region 70, state recognition section 23 may determine a shape of component region 70 to thereby recognize a supply state of component 80 based on the degree of coincidence with an estimated shape of component region 70.

A supply state of component 80 in supply region As which is recognized by state recognition section 23 includes any one of a component orientation which denotes whether a thickness direction of component 80 is oriented in the up-down direction, a degree of separation which denotes whether multiple components 80 are located closer to each other or one another than a predetermined distance, and a pickup possibility which denotes whether component 80 can be picked up from supply region As. The component orientation in the supply state may include an orientation of component 80 which changes based on which surface of that component 80 is in contact with track member 56, as well as a position or an angle of that component 80 with respect to the reference position of bulk feeder 50.

The degree of separation in the supply state denotes an extent to which one component 80 is separated from another component 80 and decreases further as the one component 80 is closer to the other component 80. The degree of separation may be understood, for example, as acceptable in the case that no other component 80 exists within a predetermined distance range from one component 80 and as unacceptable in the case that even a part of another component 80 exists within the predetermined distance range of the one component 80. For example, in the case that two or more components 80 are piled one on another or are in contact with one another in a horizontal direction, the degree of separation is lower than a reference value.

The pickup possibility in the supply state denotes whether individual components 80 supplied in supply region As are suitable for a pickup operation target object. The pickup possibility may be determined based on the component orientation or the degree of separation of components described above, or may be determined as required based on types of components 80, types of suction nozzles 134 to be used, precision required for a mounting process, or the like.

3-3. Image Processing by Image Processing Section 22 and State Recognition Section 23

As shown in FIG. 7, component 80, which constitutes a recognition target in image processing, is formed into a rectangular chip shape and has main body portion 81 and pair of terminals 82 which are provided at both ends of main body portion 81. In general, main body portion 81 is covered with, for example, a non-conductive resin film. Pair of terminals 82 are formed of a conductive metal. This configuration causes main body portion 81 and pair of terminals 82 to appear different visually. The brightness of main body portion 81 in image data 61 acquired by imaging component 80 like the one described above is lower than the brightness of terminals 82.

In addition, components 80 include a type of component 80 like a capacitor whose front and rear surfaces do not have to be distinguished from each other in function. With this type of component 80, there will be no problem whether the front surface or the rear surface is oriented upwards as long as the component is mounted in such a manner that a thickness direction constitutes an up-down direction and that pair of terminals 82 are positioned on lands of board 91. In contrast to this, components 80 include a type of component 80 like a resistor component whose front and rear surfaces are required to be distinguished from each other in function. With this type of component 80, when the component is mounted on board 91, either the front surface or the rear surface is required to be oriented upwards.

With the type of component 80 whose front and rear surfaces are required to be distinguished from each other, there is a visual difference between front surface 811 and rear surface 812 of main body portion 81. Specifically, the visual difference described above is caused by a color or characters or symbols written to indicate predetermined information, as a result of which the visual difference so caused is represented as a brightness difference in pre-processing image data 61. In the present embodiment, it is assumed that a color closer to black than that of rear surface 812 or a pattern is applied to front surface 811. The brightness of front surface 811 of main body portion 81 is lower than the brightness of rear surface 812 of main body portion 81 in image data 61 acquired by imaging component 80 like the one described above.

In the following description, it is assumed that there is a visual difference between front surface 811 and rear surface face 812 whether or not the front surface and the rear surface are required to be distinguished from each other. In FIGS. 6, 7, 9, and 10, visual differences among front surface 811, rear surface 812, and side surface 813 are shown as different dotted patterns as a matter of convenience. It should be noted that side surface 813 of main body portion 81 is visually the same as or similar to front surface 811 or rear surface 812 but has a different area from those of front surface 811 and rear surface 812. As a result, in the case that component 80 is placed in an upright state, causing a width direction of component 80 to be oriented in the up-down direction, there may be a case in which the color of side surface 813 is the same as the color of front surface 811 in pre-processing image data 61, as shown in FIG. 7. It should be noted that an upper surface of track member 56, which constitutes supply region As serving as background 74 of image data 61 is colored in a color closer to black than any portion of component 80.

3-3-1. First Manner of Image Processing

In a first manner of image processing, threshold Th is set to a value between the brightness of main body portion 81 and the brightness of terminal 82 in pre-processing image data 61. That is, in image data 61, the brightness increases in the order of background 74, front surface 811 of main body portion 81, rear surface 812 of main body portion 81, threshold Th, and terminal 82. When image processing (binarization processing) is executed by image processing section 22 using threshold Th set as described above, post-processing image data 62 is generated as shown in FIG. 7.

Specifically, in post-processing image data 62, whether any of front surface 811, rear surface 812, and side surface 813 of main body portion 81 constitutes an upper surface of component 80, terminals 82 are white, while the other portions of post-processing image data 62 such as background 74 and main body portion 81 are black. State recognition section 23 recognizes a supply state of component 80 based on a positional relationship of component region 70 (first component region 71) occupied by pair of terminals 82 of component 80 in post-processing image data 62 on which image processing has been executed, and at least one of an area and a shape of component region 70 (first component region 71).

Here, when recognizing a supply state based on the area, state recognition section 23 first calculates an area of a portion of component region 70 which is occupied by one terminal 82. For this calculation, as illustrated in FIG. 8, state recognition section 23 may calculate an area of component region 70 based on the number of pixels 75 which make up component region 70 (first component region 71) in post-processing image data 62. Specifically, state recognition section 23 counts the number of white pixels 75 which are collected together to thereby calculate an area of a portion of component region 70 through approximation based on the number of pixels 75 so counted.

State recognition section 23 compares the area calculated in the way described above with an area of terminal 82 (shown by dashed lines in FIG. 8) which is determined for each type of component 80 and recognizes that component region 70 represents terminal 82 when the calculated area falls within a range of an allowable error. For example, in the case that the area of component region 70 is smaller or larger than a range of the allowable error, it is assumed that component 80 is placed in the upright state, only a portion of lower placed terminal 82 of piled multiple components 80 is imaged, or multiple terminals 82 located adjacent to each other are imaged as a single terminal.

In addition, when recognizing a supply state based on a shape, state recognition section 23 first specifies a shape of a portion of component region 70 which is occupied by one terminal 82. For this specification, as shown in FIG. 8, state recognition section 23 specifies a shape of component region 70 based on a shape of rectangular frame 76 having a minimum area which is circumscribed on component region 70 (first component region 71) in post-processing image data 62. State recognition section 23 may set the shape itself of rectangular frame 76 as the shape of component region 70, or may set a shape resulting from offsetting inwards each side of rectangular frame 76 by a predetermined amount as the shape of component region 70.

State recognition section 23 compares the shape specified in the way described above with the shape of terminal 82 which is determined for each type of component 80 and recognizes that component region 70 represents terminal 82 in the case that the shapes are the same or similar to each other within a range of an allowable error. For example, in the case that the shape of component region 70 is dissimilar to the shape of terminal 82, it is assumed that the same cause exists as in the case in which the area of component region 70 is smaller or larger than the allowable error as when component 80 is oriented in the upright state.

State recognition section 23 recognizes pair of terminals 82 of each of multiple components 80 based on the area of component region 70 which is calculated as described above or the shape of component region 70 which is specified as described above to thereby recognize a supply state of each of components 80 in supply region As. State recognition section 23 can recognize the supply state of component 80 including at least one of component orientation, degree of separation, and pickup possibility by recognizing multiple pairs of terminals 82 from post-processing image data 62.

For this recognition, determining that component 80 can be picked up as a pickup target, state recognition section 23 can deduce coordinate values of a center position and a reference position of component 80 and an angle of component 80. The "reference position" of component 80 is a position which is arbitrarily set on the upper surface of component 80, and in the case that suction nozzle 134 is used in a pickup operation, the reference position is set, for example, at a center or a center of gravity, or on a flat region of component 80 which is suitable for picking up by suction nozzle 134. In such image processing, state recognition section 23 deduces the coordinate values of the reference position on component 80 or the angle of component 80 by recognizing, for example, the external shape or the center position of component 80 which can be picked up.

3-3-2. Second Manner of Image Processing

In a second manner of image processing, threshold Th is set to a value between the brightness of main body portion 81 and the brightness of background 74 in pre-processing image data 61. That is, in image data 61, the brightness increases in the order of background 74, threshold Th, front surface 811 of main body portion 81, rear surface 812 of main body 81, and terminal 82. When image processing (binarization processing) is executed by image processing section 22 using threshold value Th set in this way, post-processing image data 62 is generated as shown in FIG. 9.

Specifically, in post-processing image data 62, whether any of front surface 811, rear surface 812, and side surface 813 of main body portion 81 constitutes an upper surface of component 80, main body portion 81 and terminals 82 are white, while other portions or background 74 is black. State recognition section 23 recognizes a supply state based on at least one of an area and a shape of component region 70 (second component region 72) which is occupied by main body portion 81 and pair of terminals 82 of component 80 in post-processing image data 62 on which image processing has been executed.

A calculation manner of calculating an area of component region 70 and a specification manner of specifying a shape of component region 70 are substantially the same as those manners described in the first manner of image processing, and hence, detailed descriptions of the manners will be omitted here. In addition, state recognition section 23 recognizes a supply state of component 80 including at least one of component orientation, degree of separation, and pickup possibility based on at least one of the area so calculated and the shape so specified. Further, as in the case with the first manner of image processing, state recognition section 23 may deduce coordinate values of a center position or a reference position and an angle of component 80 which can be picked up.

Here, in pre-processing image data 61, the brightness of front surface 811 of main body portion 81 is different from the brightness of rear surface 812 of main body portion 81. Specifically, in the present embodiment, in image data 61, the brightness of front surface 811 is lower than the brightness of rear surface 812 of main body portion 81. Then, state recognition section 23 may recognize the front and rear surfaces of component 80 by making use of the difference in brightness between front surface 811 and rear surface 812. Specifically, state recognition section 23 deduces positions of one or more measurement points Pm on component 80 based on component region 70 (second component region 72) which is occupied by main body portion 81 and pair of terminals 82 of component 80 in post-processing image data 62.

Measurement point Pm descried above is preferably set in a position at which a difference in color between front surface 811 and rear surface 812 of main body portion 81 is remarkable. Measurement point Pm may be a center position of component 80, or may be set in a position which lies away from the center position by a predetermined distance in a predetermined direction. Multiple measurement points Pm may be set from the viewpoint of improving determination precision. However, in pre-processing image data 61, as long as the difference in brightness between front surface 811 and rear surface 812 is clear, it is good enough to provide only one measurement point Pm. The position and number of measurement points Pm are set for each type of component 80.

State recognition section 23 recognizes front and rear surfaces of component 80 based on a brightness in a position corresponding to measurement point Pm in original image data (pre-processing image data 61) on which no image processing has been executed. Specifically, when the brightness of the position corresponding to measurement point Pm in pre-processing image data 61 is close to the brightness of front surface 811, state recognition section 23 determines that front surface 811 constitutes an upper surface of component 80. On the other hand, when the brightness in the position corresponding to measurement point Pm in pre-processing image data 61 is close to the brightness of rear surface 812, state recognition section 23 determines that rear surface 812 constitutes the upper surface of component 80.

3-3-3. Third Manner of Image Processing

In a third manner of image processing, threshold Th is set to a value between a brightness of front surface 811 and a brightness of rear surface 812 of main body portion 81 in pre-processing image data 61. That is, in image data 62, the brightness increases in the order of background 74, front surface 811 of main body portion 81, threshold Th, rear surface 812 of main body portion 81, and terminal 82. When image processing (binarization processing) is executed by image processing section 22 using threshold Th set in this manner, post-processing image data 62 is generated as shown in FIG. 10.

Specifically, in post-processing image data 62, rear surface 812 and terminals 82 of main body portion 81 are white, while front surface 811 of main body portion 81 and background 74 are black. That is, in the case that front surface 811 of main body portion 81 constitutes an upper surface of component 80, only terminals 82 of that component 80 are white. In the case that rear surface 812 of main body portion 81 constitutes the upper surface of component 80, main body portion 81 and terminals 82 of that component 80 are white. In the case that side surface 813 constitutes the upper surface of component 80, although the case may change depending upon a type of component 80, in the present embodiment, as with a case in which front surface 811 of main body portion 81 constitutes the upper surface of component 80, only terminals 82 are while as shown in FIG. 10.

State recognition section 23 recognizes a supply state based on at least one of an area and a shape of component region 70 (third component region 73) which is occupied by main body portion 81 and pair of terminals 82 of component 80 or component region 70 (third component region 73) which is occupied by pair of terminals 82 in post-processing image data 62 on which image processing has been executed. A calculation manner of calculating an area of component region 70 and a specification manner of specifying a shape of component region 70 are substantially the same as those manners described in the first manner of image processing, and hence, detailed descriptions of the manners will be omitted here.

In addition, state recognition section 23 recognizes a supply state of component 80 including at least one of component orientation, degree of separation, and pickup possibility based on at least one of the area so calculated and the shape so specified. Further, as in the case with the first manner of image processing, state recognition section 23 may determine coordinate values of a center position or a reference position and an angle of that component 80 which can be picked up. As with the second manner of image processing, state recognition section 23 may recognize front and rear surfaces of component 80 by making use of a difference in brightness between front surface 811 and rear surface 812.

Specifically, state recognition section 23 recognizes front and rear surfaces of component 80 based on whether main body portion 81 is included in component region 70 (third component region 73) in post-processing image data 62. Since threshold Th is set between the brightness of front surface 811 and the brightness of rear surface 812 in pre-processing image data 61 as described above, in post-processing image data 62, the area and the shape of component region 70 greatly change depending on whether front surface 811 or rear surface 812 constitutes the upper surface of component 80. State recognition section 23 determines whether front surface 811 or rear surface 812 constitutes the upper surface of component 80 based on the difference in area and shape of component region 70.

3-4. Control of Pickup Operation by Control Device 20

Control device 20 executes a pickup operation of component 80 based on the supply state thereof which is recognized through image processing. Control device 20 regards components 80 supplied to supply region As in appropriate orientations as pickup targets. Specifically, control device 20 extracts only a necessary number of components 80 to be picked up through a pickup operation in the current PP cycle from components 80 which can be picked up and which are included in the results of the supply state recognition processing.

When the number of components 80 which can be picked up in the result of the supply state recognition processing exceeds a necessary number, control device 20 extracts positions of multiple components 80 so as to reduce a time required for pickup operations which are executed over multiple times. Specifically, control device 20 may extract positions of multiple components 80 so as to reduce a total moving distance of mounting head 133 which is operated over the number of times corresponding to a necessary number or may preferentially extract components 80 located close to board 91 as mounting targets. Then, control device 20 executes the pickup operation on a necessary number of components 80 so extracted as mounting targets.

4. Mounting Process by Component Mounter 10

Figure 11:
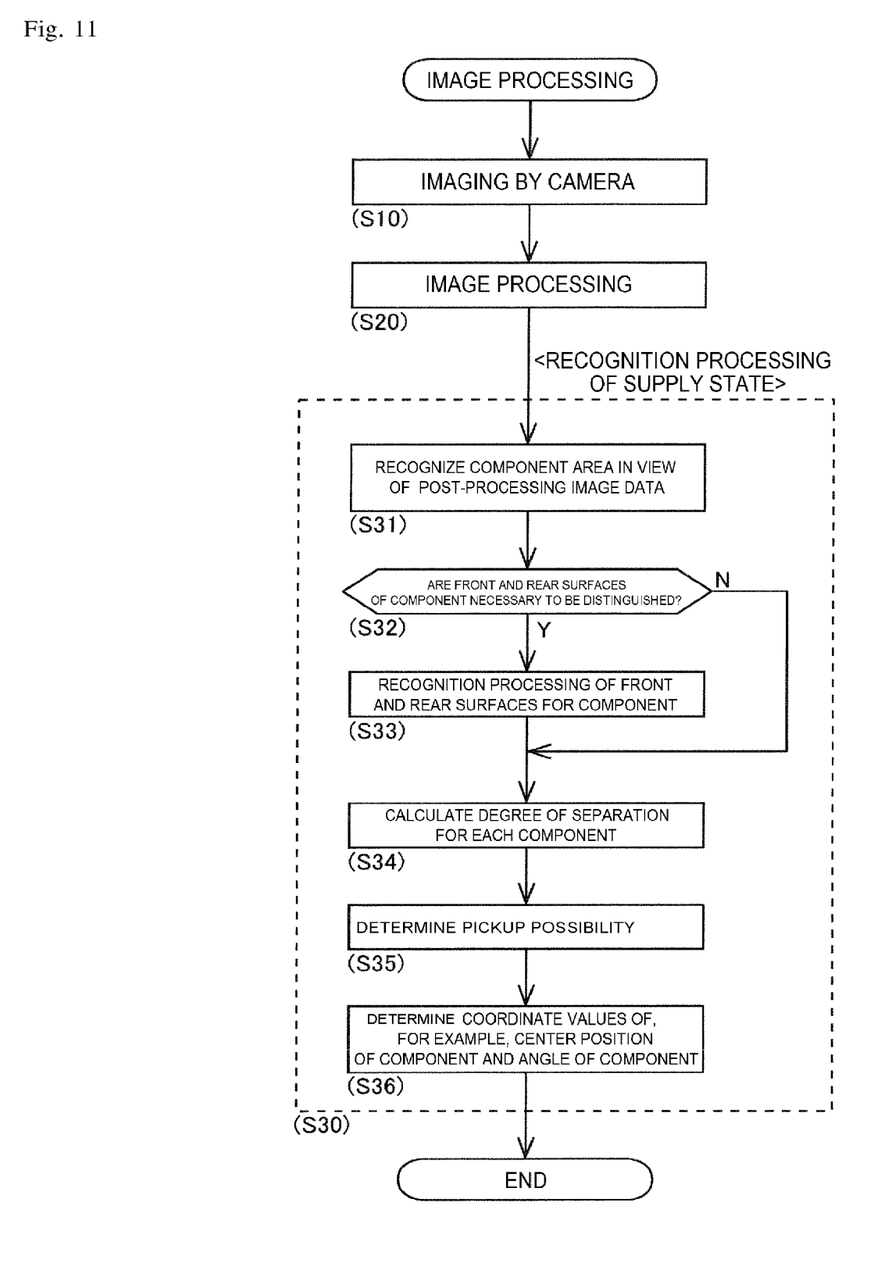
FIG. 11 is a flowchart showing image processing executed by the component mounter.

Referring to FIG. 11, a mounting process by component mounter 10 will be described. After bulk feeder 50 is set in slot 121, control device 20 executes calibration processing to thereby recognize the position of supply region As in the component mounter. Specifically, control device 20 first causes board camera 15 to move over three reference marks 55 of bulk feeder 50, and acquires image data by imaging those three reference marks 55 using board camera 15. Then, control device 20 recognizes the position of bulk feeder 50 in the component mounter, that is, the position of supply region As, based on the positions of three reference marks 55 included in the image data as a result of image processing and the position of board camera 15 when those three reference marks 55 are imaged thereby.

In the mounting process, control device 20 causes bulk feeder 50 to execute a component supply process, so that multiple components 80 are supplied to supply region As in bulk. Bulk feeder 50 inputs a control command from control device 20 and executes the component supply process at an appropriate timing, for example, when board 91 is conveyed by board conveyance device 11, when mounting operations are executed in the PP cycle, and the like. After the component supply process is executed by bulk feeder 50, control device 20 executes image processing as shown in FIG. 11.

Firstly, control device 20 causes board camera 15 to execute imaging (S10). Specifically, control device 20 causes board camera 15 to move above supply region As of bulk feeder 50 and acquires image data 61 through imaging by board camera 15. In addition, control device 20 sets image processing that is applied to image data 61 in accordance with types of components 80 supplied by bulk feeder 50. Image processing may be set in advance by an operator and be designated by data such as a control program.

Next, image processing section 22 executes an image processing process (S20). Specifically, image processing section 22 acquires threshold Th corresponding to the image processing so set from threshold information M1, executes binarization processing on pre-processing image data 61, and generates post-processing image data 62. Subsequently, state recognition section 23 executes supply state recognition processing (S30). Specifically, state recognition section 23 first recognizes component region 70 in post-processing image data 62 (S31). As a result, state recognition section 23 recognizes at least one of an area and a shape of each component region 70.

State recognition section 23 determines whether a front surface and a rear surface of component 80 need be distinguished from each other (S32). In the case that component 80 is of a type requiring a front surface and a rear surface thereof to be distinguished from each other functionally like, for example, a resistor component (S 32: Yes), state recognition section 23 executes recognition processing of the front surface and the rear surface of component 80 (S 33). Specifically, the front surface and the rear surface of component 80 are recognized by using pre-processing image data 61 as illustrated in the second manner of image processing or the difference in area or shape of component 80 in post-processing image 62 as illustrated in the third manner of image processing.

Executing the processing described above determines a component orientation as a supply state (an orientation denoting whether the orientation is appropriate and, when required, denoting which of front surface 811 and rear surface 812 constitutes the upper surface). After the recognition processing of the front surface and the rear surface of component 80 (S33), or in the case that component 80 is of a type obviating the necessity of distinguishing the front surface from the rear surface functionally like, for example, a capacitor (S32: No), state recognition section 23 calculates the degree of separation for each component 80 (S34). As a result, an extent to which some components 80 are separated from other components 80 in supply region As is calculated.

Subsequently, state recognition section 23 determines a pickup possibility for each component 80 (S35). Specifically, state recognition section 23 determines whether each component 80 is suitable for a pickup operation target based, for example, on component orientation and degree of separation. Finally, regarding component 80 that can be picked up as a pickup target, state recognition section 23 determines coordinate values of a center position and a reference position of that component 80 and an angle of that component 80 (S36), and ends the supply state recognition processing.

In a PP cycle, control device 20 repeatedly executes a pickup operation for picking up components 80 using multiple suction nozzles 134 based on the results of the image processing. For this pickup operation, control device 20 controls the operation of mounting head 133 in the pickup operation so as to sequentially position mounting head 133 in accordance with positions of components 80 that can be picked up. Control device 20 repeatedly executes the PP cycle based on a control program until components 80 are completely mounted in all mounting positions as required.

With the configuration that has been described heretofore, the supply state of the component is recognized based on at least one of the area and the shape of component region 70 in post-processing image data 62 on which the processing has been executed in which the region of at least a part of component 80 and the region of background 74 are distinguished from each other based on brightness. As a result, component region 70 is made clear against background 74, so that the precision of the image processing can be improved. In addition, since the supply state of component 80 is recognized based on the area or the shape of component region 70 in the supply state recognition processing (S30), the supply state including the determination on whether component 80 is suitable for the mounting process can be recognized efficiently for each of multiple components 80 supplied in bulk.

5. Modified Manner of Embodiment

In the embodiment, board camera 15 is described as the camera for imaging supply region As of bulk feeder 50. In contrast with this, component mounter 10 may include a camera provided above bulk feeder 50 for imaging supply region As. The camera may be dedicated to imaging supply region As or may also be used for other purposes. With such a configuration, the camera is fixed in position to thereby improve the precision of the calibration processing. However, the manner described in the embodiment is preferable from the viewpoint of reducing the facility cost.

REFERENCE SIGNS LIST

10: component mounter, 12: component supply device, 15: board camera, 20: control device, 21: storage section, 22: image processing section, 23: state recognition section, 50: bulk feeder, 61: (pre-processing) image data, 61A: extraction region (in pre-processing image data, 62: (post-processing) image data, 62A: extraction region (in post-processing image data), 70: component region, 71: first component region (of a first manner), 72: second component region (of a second manner), 73: third component region (of a third manner), 74: background, 75: pixels, 76: rectangular frame, 80: component, 81: main body portion, 811: front surface, 812: rear surface, 813: side surface, 82: (pair of) terminals, 91: board, Ar: receiving region, As: supply region, R: conveyance path, M1: threshold information, Th: threshold, Pm: measurement point.

The invention claimed is:

1. A component mounter comprising:
   a component supply device equipped with a bulk feeder for supplying multiple components in a bulk state to a supply region for the components;
   a camera to image the supply region; and
   control circuitry including:
      an image processing section that executes image processing for distinguishing a region of at least a part of the component from a region of a background in image data acquired through imaging by the camera based on brightness, the image processing including binarization processing on the image data using a threshold which is set to a value between a brightness of the component and a brightness of the background; and
      a state recognition section that recognizes a supply state of the component based on at least one of an area and a shape of a component region occupied by at least the part of the component in the image data on which the image processing has been executed,
   wherein the component has a main body portion and a pair of terminals which are provided at both ends of the main body portion,
   wherein a brightness of the main body portion is lower than a brightness of the terminal in the image data, and
   wherein the threshold is set by the control circuitry based on the brightness of the main body portion.

2. The component mounter according to claim 1,
   wherein the supply state in the supply region includes at least one of a component orientation which denotes whether a thickness direction of the component is oriented in an up-down direction, a degree of separation which denotes whether multiple components are closer to each other or one another than a predetermined distance, and a pickup possibility which denotes whether the component can be picked up from the supply region.

3. The component mounter according to claim 1, wherein the threshold is set by the control circuitry to a value between the brightness of the main body portion and the brightness of the terminal in the image data.

4. The component mounter according to claim 3, wherein the state recognition section of the control circuitry recognizes the supply state based on a positional relationship and at least one of an area and a shape of the component region which is occupied by the pair of terminals of the component in the image data on which the image processing has been executed.

5. The component mounter according to claim 1, wherein the threshold is set by the control circuitry to a value between the brightness of the main body portion and the brightness of the background.

6. The component mounter according to claim 5, wherein a brightness of a front surface of the main body portion differs from a brightness of a rear surface of the main body portion in the image data, and
wherein the state recognition section of the control circuitry:
determines positions of one or more measurement points on the component based on the component region which is occupied by the main body portion and the pair of terminals of the component in the image data on which the image processing has been executed, and
recognizes the front surface and the rear surface of the component based on brightnesses of positions corresponding to the measurement points in the original image data on which the image processing has not been executed yet.

7. The component mounter according to claim 1,
wherein the component has a main body portion and a pair of terminals which are provided at both ends of the main body portion,
wherein a brightness of a rear surface of the main body portion is lower than a brightness of the terminals in the image data,
wherein a brightness of a front surface of the main body portion is lower than the brightness of the rear surface of the main body portion in the image data, and
wherein the threshold set by the control circuitry is to a value between the brightness of the front surface and the brightness of the rear surface of the main body portion in the image data.

8. The component mounter according to claim 7,
wherein the state recognition section of the control circuitry recognizes the front surface and the rear surface of the component based on whether the main body portion is included in the component region in the image data on which the image processing has been executed.

9. The component mounter according to claim 1,
wherein the state recognition section of the control circuitry calculates an area of the component region based on an amount of pixels which make up the component region in the image data on which the image processing has been executed, and recognizes the supply state based on the area of the component region so calculated.

10. The component mounter according to claim 1,
wherein the state recognition section of the control circuitry specifies a shape of the component region based on a shape of a rectangular frame of a minimum area which is circumscribed on the component region in the image data on which the image processing has been executed, and recognizes the supply state based on the shape of the component region so specified.

* * * * *